US012653014B2

(12) United States Patent
Lee et al.

(10) Patent No.: US 12,653,014 B2
(45) Date of Patent: Jun. 9, 2026

(54) SEMICONDUCTOR DEVICE HAVING VIA STRUCTURE VERTICALLY PENETRATING METAL LAYER AND SUBSTRATE

(71) Applicant: Samsung Electronics Co., Ltd., Suwon-si (KR)

(72) Inventors: Seonhaeng Lee, Suwon-si (KR); Hyunggyun Noh, Suwon-si (KR); Sung-Mock Ha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 363 days.

(21) Appl. No.: 18/459,588

(22) Filed: Sep. 1, 2023

(65) Prior Publication Data

US 2024/0258203 A1     Aug. 1, 2024

(30) Foreign Application Priority Data

Jan. 31, 2023    (KR) ........................ 10-2023-0012724

(51) Int. Cl.
| | |
|---|---|
| *H10W 20/20* | (2026.01) |
| *H10W 70/65* | (2026.01) |
| *H10W 90/00* | (2026.01) |
| *H10W 20/00* | (2026.01) |
| *H10W 90/20* | (2026.01) |

(52) U.S. Cl.
CPC ........... *H10W 20/20* (2026.01); *H10W 70/65* (2026.01); *H10W 90/00* (2026.01); *H10W 90/701* (2026.01); *H10W 90/297* (2026.01)

(58) Field of Classification Search
CPC ............. H01L 23/481; H01L 23/49816; H01L 23/49838; H01L 25/0657; H10W 20/20; H10W 70/65; H10W 90/00; H10W 90/701; H10W 90/297; H10W 20/023; H10W 20/40; H10W 20/42
See application file for complete search history.

(56) References Cited

U.S. PATENT DOCUMENTS

| | | | |
|---|---|---|---|
| 8,049,327 | B2 | 11/2011 | Kuo et al. |
| 8,319,329 | B2 | 11/2012 | Kang et al. |
| 8,841,213 | B2 | 9/2014 | Shimoi et al. |
| 9,006,902 | B2 | 4/2015 | Choi et al. |
| 9,795,026 | B2 | 10/2017 | Mahanta et al. |

(Continued)

FOREIGN PATENT DOCUMENTS

| | | |
|---|---|---|
| KR | 10-2010-0048610 A | 5/2010 |
| KR | 10-2010-0086442 A | 7/2010 |

(Continued)

*Primary Examiner* — Michael Jung
(74) *Attorney, Agent, or Firm* — Harness, Dickey & Pierce, P.L.C.

(57) ABSTRACT

A semiconductor device may include a substrate having a first surface and a second surface opposite to the first surface, a protection layer on the first surface of the substrate, metal layers in the substrate, extending in a first direction parallel to the first surface, and spaced apart from each other in a second direction perpendicular to the first surface, a via structure vertically penetrating the metal layers and the substrate, a circuit layer on the second surface of the substrate, and a connection terminal on a bottom surface of the circuit layer. Each of the metal layers may have a tetragonal or circular shape, when viewed in a plan view.

19 Claims, 10 Drawing Sheets

(56) References Cited

U.S. PATENT DOCUMENTS

| | | | |
|---|---|---|---|
| 9,985,062 | B2 | 5/2018 | Jung |
| 2010/0181105 | A1 | 7/2010 | Hitomi et al. |
| 2013/0333927 | A1 | 12/2013 | Cho et al. |
| 2019/0311973 | A1 | 10/2019 | Ingerly et al. |
| 2020/0335858 | A1* | 10/2020 | Chen ........................ H01Q 1/38 |
| 2021/0082784 | A1 | 3/2021 | Cheng et al. |
| 2021/0375838 | A1* | 12/2021 | Goto ......................... H03F 3/20 |
| 2022/0367430 | A1* | 11/2022 | Lee ................... H01L 23/49838 |
| 2024/0008251 | A1* | 1/2024 | Sharma .................. H10D 1/716 |
| 2024/0120305 | A1* | 4/2024 | Ecton ................. H01L 23/5381 |

FOREIGN PATENT DOCUMENTS

| | | | |
|---|---|---|---|
| KR | 10-1117444 | B1 | 3/2012 |
| KR | 10-1153222 | B1 | 6/2012 |
| KR | 10-2012-0121796 | A | 11/2012 |
| KR | 10-2013-0139655 | A | 12/2013 |
| KR | 10-1439191 | B1 | 9/2014 |
| KR | 10-2017-0042940 | A | 4/2017 |
| KR | 10-1880148 | B1 | 7/2018 |
| KR | 10-2031908 | B1 | 10/2019 |
| KR | 10-2297283 | B1 | 9/2021 |

* cited by examiner

SEMICONDUCTOR DEVICE HAVING VIA STRUCTURE VERTICALLY PENETRATING METAL LAYER AND SUBSTRATE

CROSS-REFERENCE TO RELATED APPLICATIONS

This U.S. non-provisional patent application claims priority under 35 U.S.C. § 119 to Korean Patent Application No. 10-2023-0012724, filed on Jan. 31, 2023, in the Korean Intellectual Property Office, the entire contents of which are hereby incorporated by reference.

BACKGROUND

The present disclosure relates to semiconductor devices, and in particular, to semiconductor devices including a via structure.

Various methods of stacking semiconductor devices have been proposed to realize a semiconductor device with high density and high performance characteristics. For example, there are a multi-chip package, in which a plurality of chips are mounted in a single semiconductor package, or a system-in-package including a plurality of stacked chips of different kinds, which are operated as a single system. In the case where the semiconductor devices are stacked, it is necessary to increase an operation speed of the stacked semiconductor devices. The semiconductor device is electrically connected to another semiconductor device or a printed circuit board through a conductive via. The conductive via is used to realize the increased operation speed. As an integration density of the semiconductor device increases, it is necessary to develop a conductive via with improved reliability.

SUMMARY

An example embodiment of the inventive concepts provides a semiconductor device with improved thermal stability.

According to an example embodiment of the inventive concepts, a semiconductor device includes a substrate having a first surface and a second surface opposite to the first surface, a protection layer on the first surface of the substrate, metal layers in the substrate, the metal layers extending in a first direction parallel to the first surface, the metal layers spaced apart from each other in a second direction perpendicular to the first surface, a via structure vertically penetrating the metal layers and the substrate, a circuit layer on the second surface of the substrate, and a connection terminal on a bottom surface of the circuit layer, wherein each of the metal layers has a tetragonal or circular shape, when viewed in a plan view.

According to an example embodiment of the inventive concepts, a semiconductor device includes a semiconductor substrate having a first surface and a second surface opposite to the first surface, a circuit layer on the second surface of the semiconductor substrate, a connection terminal on a bottom surface of the circuit layer, a via structure vertically penetrating the semiconductor substrate, and metal layers penetrating the via structure in a first direction parallel to the first surface of the semiconductor substrate, wherein the metal layers are spaced apart from each other in a second direction perpendicular to the first surface of the semiconductor substrate, and the metal layers includes first portions, extending in the first direction to penetrate the via structure, and second portions extending in a third direction crossing the first direction and connecting opposite end portions of the first portions to each other.

According to an example embodiment of the inventive concepts, a semiconductor device includes a semiconductor substrate having a first surface and a second surface opposite to the first surface, a circuit layer on the second surface of the semiconductor substrate, a connection terminal on a bottom surface of the circuit layer, a via structure vertically penetrating the semiconductor substrate, and metal layers protruding outward from the via structure, wherein the metal layers are spaced apart from each other in a direction perpendicular to the semiconductor substrate, the via structure includes first vias separated from each other in the first direction, a second via provided between the first vias, and insulating layers interposed between the first vias and the second via, and the metal layers are in contact with an outer side surface of each of the first vias.

BRIEF DESCRIPTION OF THE DRAWINGS

FIG. 13 is a sectional view illustrating a semiconductor package including a semiconductor device according to an example embodiment of the inventive concepts.

DETAILED DESCRIPTION

Example embodiments of the inventive concepts will now be described more fully with reference to the accompanying drawings, in which some example embodiments are shown.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
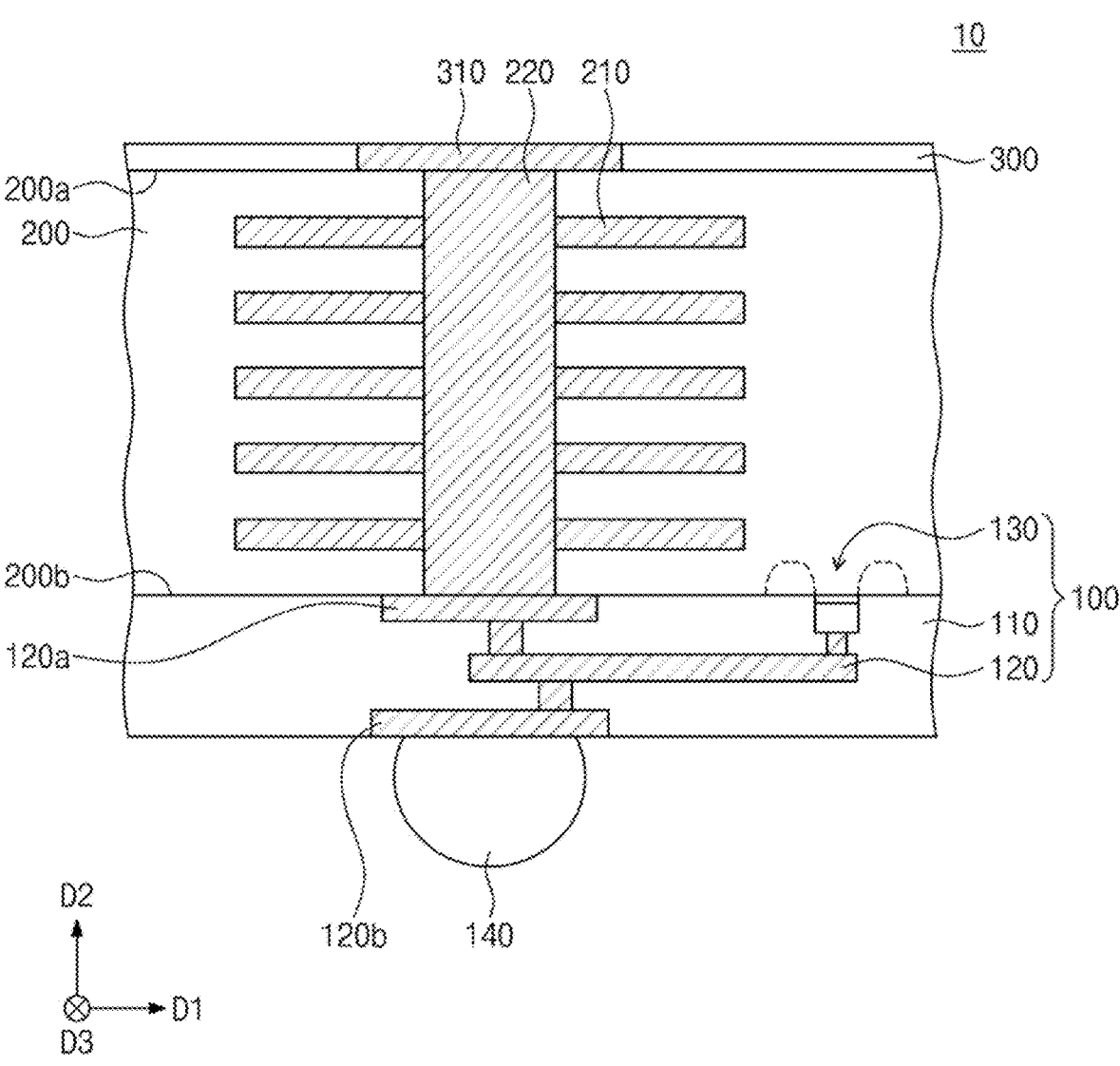
FIG. 1 is a sectional view illustrating a semiconductor device according to an example embodiment of the inventive concepts.
Figure 2:
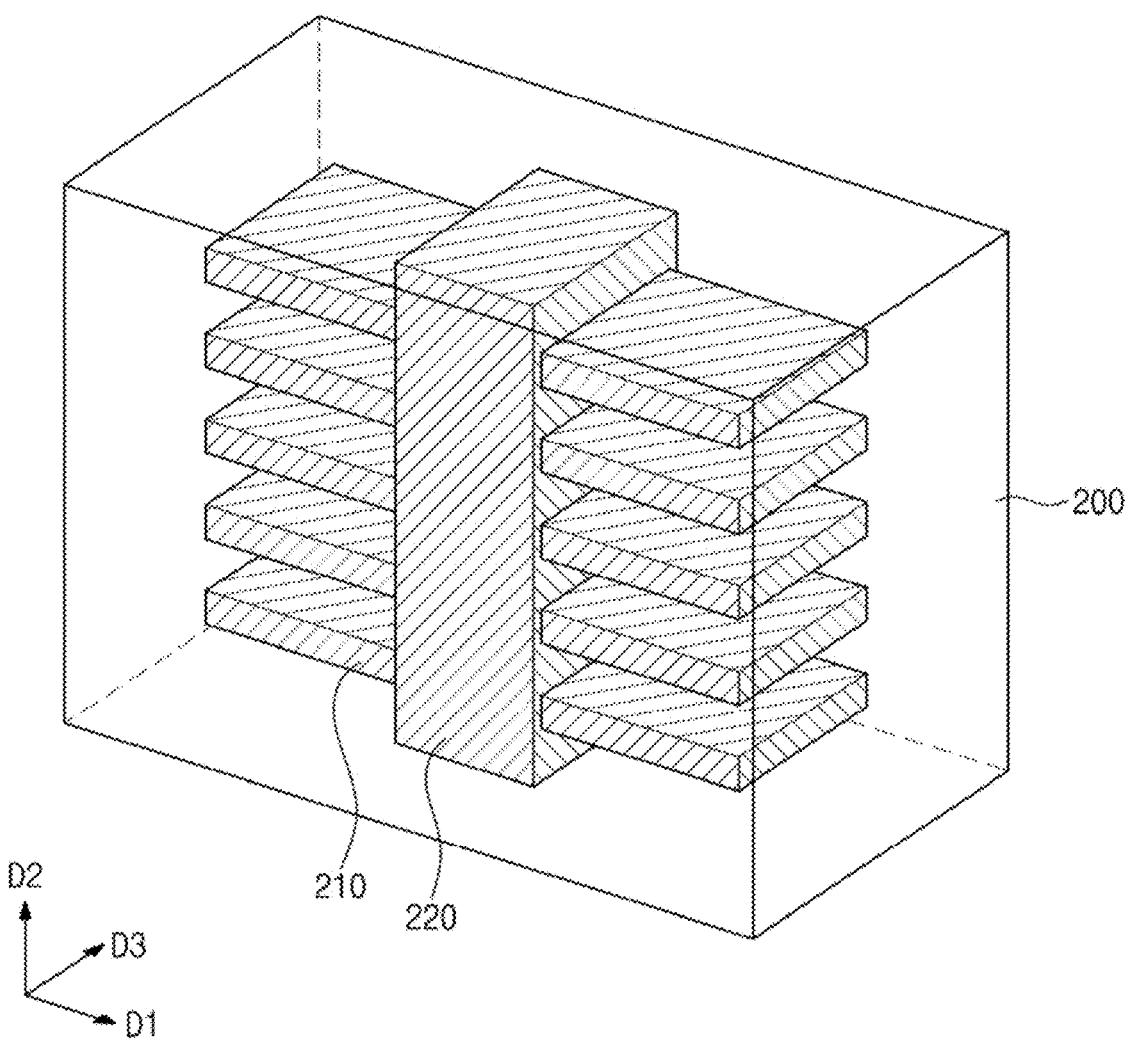
FIG. 2 is a perspective view illustrating a semiconductor device according to an example embodiment of the inventive concepts.
Figure 3:
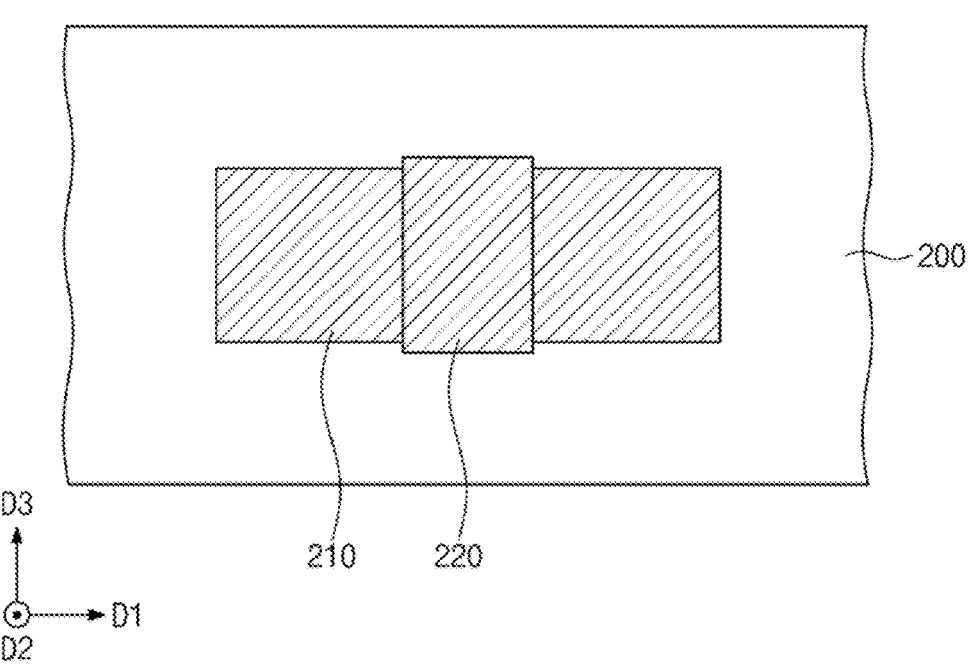
FIGS. 3 and 4 are plan views, each of which illustrates a semiconductor device according to some example embodiments of the inventive concepts.

FIG. 1 is a sectional view illustrating a semiconductor device according to an example embodiment of the inventive concepts. FIG. 2 is a plan view illustrating a semiconductor device according to an example embodiment of the inventive concepts. FIG. 3 is a perspective view illustrating a semiconductor device according to an example embodiment of the inventive concepts.

Referring to FIGS. 1 to 3, a semiconductor device 10 may include a circuit layer 100, a semiconductor substrate 200, a protection layer 300, and a connection terminal 140.

The semiconductor substrate 200 may include a first surface 200*a* and a second surface 200*b*, which are opposite to each other. The semiconductor substrate 200 may be a semiconductor substrate that is formed of or includes one of silicon (Si), germanium (Ge), silicon-germanium (Si—Ge), or compound semiconductor materials. In an example embodiment, the semiconductor substrate 200 may be a silicon wafer.

In the present specification, a first direction D1 and a third direction D3 may be parallel to the first surface 200*a* of the semiconductor substrate 200. The third direction D3 may be perpendicular to the first direction D1. A second direction D2 may be perpendicular to the first surface 200*a* of the semiconductor substrate 200 or may be perpendicular to both of the first and third directions D1 and D3.

Metal layers 210 may be provided in the semiconductor substrate 200. Hereinafter, the structure or shape of the metal layers 210 will be described based on one of the metal layers 210.

The metal layer 210 may be a plate-shaped pattern. In the semiconductor substrate 200, the metal layer 210 may be extended in the first and third directions D1 and D3. In an example embodiment, the metal layer 210 may be a bar-shaped pattern, which is extended in the first direction D1. The metal layer 210 may have a tetragonal (e.g., rectangular or square) shape, when viewed in a plan view, but the inventive concepts are not limited to this example. In an example embodiment, the metal layer 210 may have a circular or polygonal shape, when viewed in a plan view. In some example embodiments, the metal layer 210 may have a rounded tetragonal shape, when viewed in a plan view. When measured in the first direction D1, a width of the metal layer 210 may be smaller than a width of the semiconductor substrate 200. A thickness of the metal layer 210 may be smaller than a thickness of the semiconductor substrate 200. The metal layer 210 may be formed of or include at least one of copper (Cu), aluminum (Al), tungsten (W), or titanium (Ti).

The metal layers 210 may be arranged in the second direction D2, between the first and second surfaces 200*a* and 200*b* of the semiconductor substrate 200. The metal layers 210 may be spaced apart from each other in the second direction D2. The metal layers 210 may be spaced apart from the first and second surfaces 200*a* and 200*b* of the semiconductor substrate 200. The metal layers 210 may vertically overlap each other. In an example embodiment, the metal layers 210 may be vertically aligned to each other, but the inventive concepts are not limited to this example. The metal layers 210 may be disposed to form a zigzag shape in the second direction D2. For example, each of the metal layers 210 may be shifted from another metal layer 210, which is placed on or below the same, in the first or third directions D1 or D3. In some example embodiments, the metal layers 210 may have a stepwise structure.

Each of the metal layers 210 is illustrated to have the same size, but the inventive concepts are not limited to this example. For example, the metal layers 210 may have at least two different sizes. In addition, the metal layers 210 may be stacked in such a way that vertically adjacent ones of them are spaced apart from each other by the same distance, but in an example embodiment, the metal layers 210 may be stacked in such a way that vertically adjacent ones of them are spaced apart from each other by different distances.

A via structure 220 may vertically penetrate the semiconductor substrate 200 and the metal layers 210. In other words, the metal layers 210 may have a shape protruding outward from the via structure 220. In some example embodiments, the metal layers 210 may penetrate the via structure 220 in the first direction D1. The via structure 220 may be a pillar-shaped structure extending in the second direction D2. A top surface of the via structure 220 may be exposed to the outside of the semiconductor substrate 200 near or at the first surface 200*a* of the semiconductor substrate 200. A bottom surface of the via structure 220 may be exposed to the outside of the semiconductor substrate 200 near or at the second surface 200*b* of the semiconductor substrate 200. In other words, the via structure 220 may completely penetrate the semiconductor substrate 200 in the second direction D2. A portion of a side surface of the via structure 220 may be in contact with the metal layers 210. Another portion of the side surface of the via structure 220 may be in contact with the semiconductor substrate 200. When measured in the first direction D1, a width of the via structure 220 may be smaller than the width of each of the metal layers 210. When viewed in a plan view, the via structure 220 may have a tetragonal (e.g., rectangular or square) shape or a circular shape. The via structure 220 may be formed of or include at least one of conductive materials. The via structure 220 may be formed of or include the same material or substantially similar material as the metal layers 210. In some example embodiments, the via structure 220 may be formed of or include a material that is different from the material of the metal layers 210. The via structure 220 may be formed of or include at least one of copper (Cu), aluminum (Al), tungsten (W), or titanium (Ti).

The circuit layer 100 may be provided on the second surface 200*b* of the semiconductor substrate 200. The circuit layer 100 may include an insulating layer 110, an interconnection pattern 120, and an integrated device 130.

The integrated device 130 may be provided on the second surface 200*b* of the semiconductor substrate 200. The integrated device 130 may be laterally spaced apart from the metal layers 210. In an example embodiment, a plurality of integrated devices 130 may be provided, although not shown. The integrated device 130 may include a memory circuit, a logic circuit, or combinations thereof. The integrated device 130 is illustrated to be a planar transistor, but the inventive concepts are not limited to this example. For example, the integrated device 130 may include a gate-all-around (GAA) transistor or a vertical transistor, and in an example embodiment, it may further include a passive device (e.g., a resistor or a capacitor).

The insulating layer 110 may be provided on the second surface 200*b* of the semiconductor substrate 200. The insulating layer 110 may be provided on the second surface 200*b* of the semiconductor substrate 200 to cover the integrated device 130. The insulating layer 110 may include a single layer or may include a plurality of stacked layers. The insulating layer 110 may be formed of or include at least one of silicon oxide, silicon nitride, or silicon oxynitride.

The interconnection pattern 120 may be provided in the insulating layer 110. The interconnection pattern 120 may include a wire portion and a via portion. The wire portion may be an interconnection pattern, which is provided in the insulating layer 110 and is horizontally extended. The via portion may be an interconnection pattern, which vertically penetrates a portion of the insulating layer 110 and connects to the wire portion. The interconnection pattern 120a, which is the uppermost one of the interconnection patterns 120, may be exposed to the outside of the circuit layer 100 near or at a top surface of the circuit layer 100. The uppermost interconnection pattern 120a may be coupled to the via structure 220. Unlike the illustrated structure, the via structure 220 may penetrate at least a portion of the circuit layer 100 and may be coupled to the interconnection pattern 120. The interconnection pattern 120b, which is the lowermost one of the interconnection patterns 120, may be exposed to the outside of the circuit layer 100 near or at a bottom surface of the circuit layer 100. The lowermost interconnection pattern 120b may be used as a pad, on which the connection terminal 140 will be disposed. The interconnection pattern 120 may be spaced apart from the metal layers 210. The via structure 220 and the integrated device 130 may be electrically connected to each other through the interconnection pattern 120. In the present specification, the expression "electrically connected or coupled" may mean that a plurality of elements are directly connected/coupled to each other or are indirectly connected or coupled to each other via another conductive element. The interconnection pattern 120 may be formed of or include at least one of copper (Cu), aluminum (Al), tungsten (W), or titanium (Ti).

At least one connection terminal 140 may be provided on the bottom surface of the circuit layer 100. The connection terminal 140 may be disposed on the lowermost interconnection pattern 120b. The connection terminal 140 may be electrically connected to the integrated device 130 and the via structure 220 through the interconnection pattern 120. The connection terminal 140 may be configured to enable the semiconductor device 10 to be coupled to another semiconductor device or a connection substrate disposed under the same. The connection terminal 140 may include a solder ball and/or a solder bump. The connection terminal 140 may be formed of or include at least one of tin (Sn), lead (Pb), silver (Ag), zinc (Zn), nickel (Ni), gold (Au), copper (Cu), aluminum (Al), or bismuth (Bi).

A connection pad 310 may be provided on the first surface 200a of the semiconductor substrate 200. The connection pad 310 may be disposed on the top surface of the via structure 220. The connection pad 310 may be coupled to the via structure 220. The connection pad 310 may be spaced apart from the metal layers 210. The connection pad 310 may be formed of or include at least one of conductive materials. For example, the connection pad 310 may be formed of or include at least one of copper (Cu), nickel (Ni), aluminum (Al), tungsten (W), or titanium (Ti).

The protection layer 300 may be provided on the first surface 200a of the semiconductor substrate 200. The protection layer 300 may cover the first surface 200a of the semiconductor substrate 200. The protection layer 300 on the first surface 200a of the semiconductor substrate 200 may expose the top surface of the via structure 220. The protection layer 300 may enclose a side surface of the connection pad 310 and may expose a top surface of the connection pad 310.

According to an example embodiment of the inventive concepts, the metal layers 210 may be connected to the via structure 220 and may be used to effectively dissipate heat energy, which is generated in the semiconductor device 10. Thus, it may be possible to improve thermal stability of the semiconductor device 10.

Figure 4:
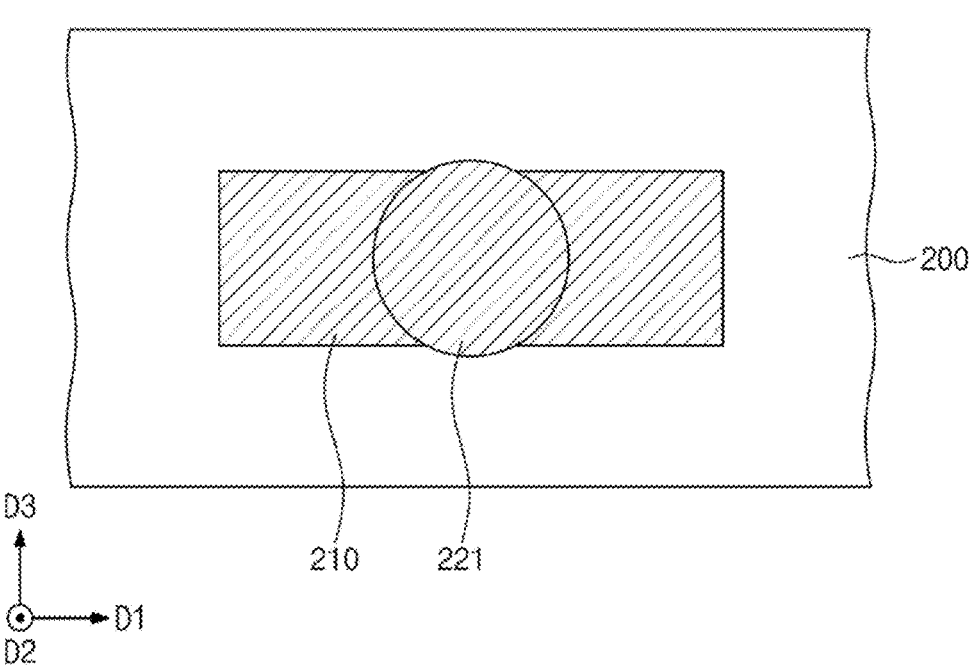

FIG. 4 is a plan view illustrating a semiconductor device according to an example embodiment of the inventive concepts. In the following description, an element described above may be identified by the reference number without repeating an overlapping description thereof, for the sake of brevity.

Referring to FIG. 4, a semiconductor device 11 may have the same or substantially similar structure as the semiconductor device 10 described with reference to FIG. 1. However, unlike the example embodiment of FIG. 3, the semiconductor device 11 may include a via structure 221, which has a circular shape when viewed in a plan view. A diameter of the via structure 221 in the first direction D1 may be smaller than the width of each of the metal layers 210, when viewed in a plan view. Unlike the illustrated example, when viewed in a plan view, the via structure 221 may be disposed in the metal layers 210 and may not protrude from side surfaces of the metal layers 210.

Figure 5:
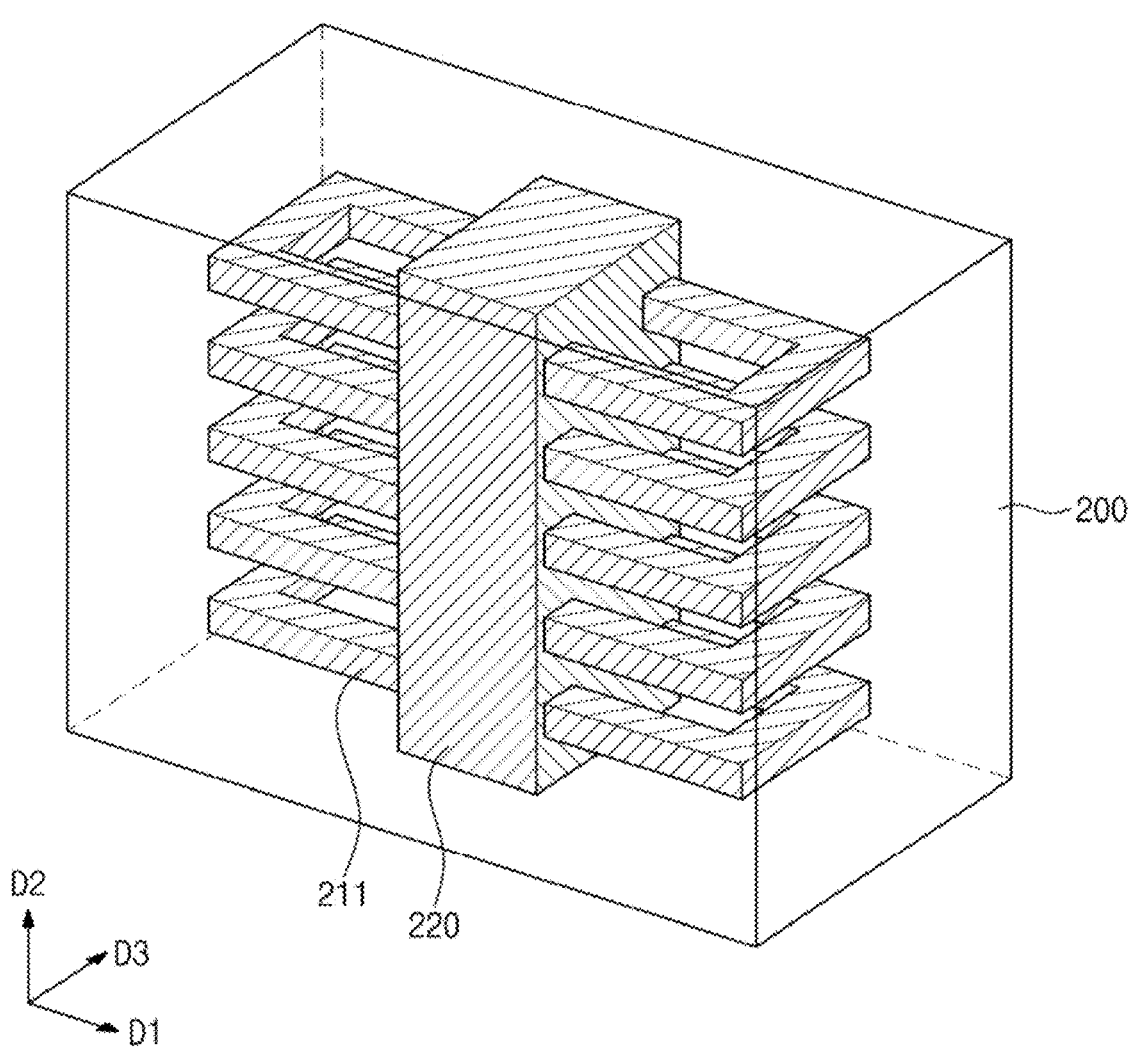
FIG. 5 is a perspective view illustrating a semiconductor device according to an example embodiment of the inventive concepts.
Figure 6:
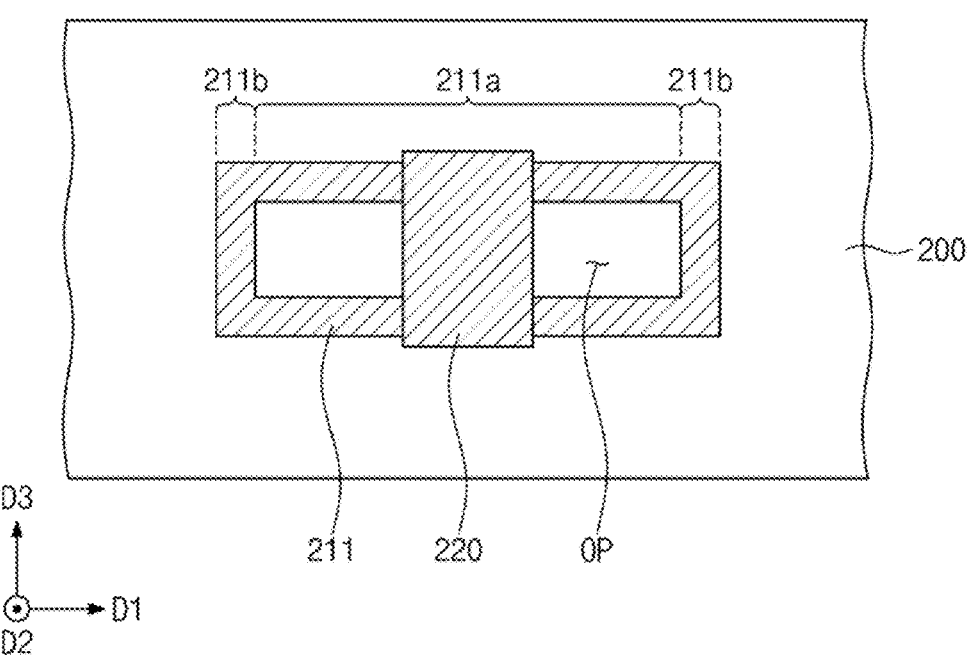
FIGS. 6 to 8 are plan views, each of which illustrates a semiconductor device according to an embodiment of the inventive concepts.

FIG. 5 is a perspective view illustrating a semiconductor device according to an example embodiment of the inventive concepts. FIG. 6 is a plan view illustrating a semiconductor device according to an example embodiment of the inventive concepts. In the following description, an element described above may be identified by the reference number without repeating an overlapping description thereof, for the sake of brevity.

Referring to FIGS. 5 and 6, a semiconductor device 12 may have the same or substantially similar structure as the semiconductor device 10 described with reference to FIG. 1. However, the semiconductor device 12 may include metal layers 211 having a different shape from that of FIGS. 2 and 3.

Each of the metal layers 211 may have a ring shape. Each of the metal layers 211 may include first portions 211a, which are extended in the first direction D1 and penetrate the via structure 220. Each of the first portions 211a may be a bar-shaped pattern, which extends in the first direction D1. The first portions 211a of the metal layers 211 may protrude from the via structure 220 in the first direction D1 and an opposite direction of the first direction D1. The first portions 211a may be spaced apart from each other in the third direction D3. When measured in the third direction D3, a distance between the first portions 211a may be smaller than the width of the via structure 220. Thus, the metal layers 211 may be in contact with the via structure 220. Each of the metal layers 211 may include second portions 211b extending in the third direction D3. Each of the second portions 211b may be a bar-shaped pattern, which extends in the third direction D3. The second portions 211b may connect opposite end portions of the first portions 211a to each other. Here, the first portions 211a and the second portions 211b may be connected to have no observable interface therebetween. The second portions 211b may be spaced apart from each other in the first direction D1. When viewed in a plan view, the metal layers 211 have a tetragonal (e.g., rectangular or square) shape, but in some example embodiments, the metal layers 211 may have a rounded tetragonal shape, a polygonal shape, or a circular shape.

Each of the metal layers 211 may have openings OP, which connect top and bottom surfaces thereof. The openings OP of the metal layers 211 may include a first opening and a second opening, which are spaced apart from each other with the via structure 220 interposed therebetween. A shape of each of the openings OP of the metal layers 211 may be defined by inner side surfaces of the metal layers 211, which face the via structure 220, and two side surfaces of the via structure 220, which are adjacent thereto. The openings OP of the metal layers 211 may vertically overlap each other. In an example embodiment, the openings OP of the metal layers 211 may be vertically aligned to each other.

Figure 7:
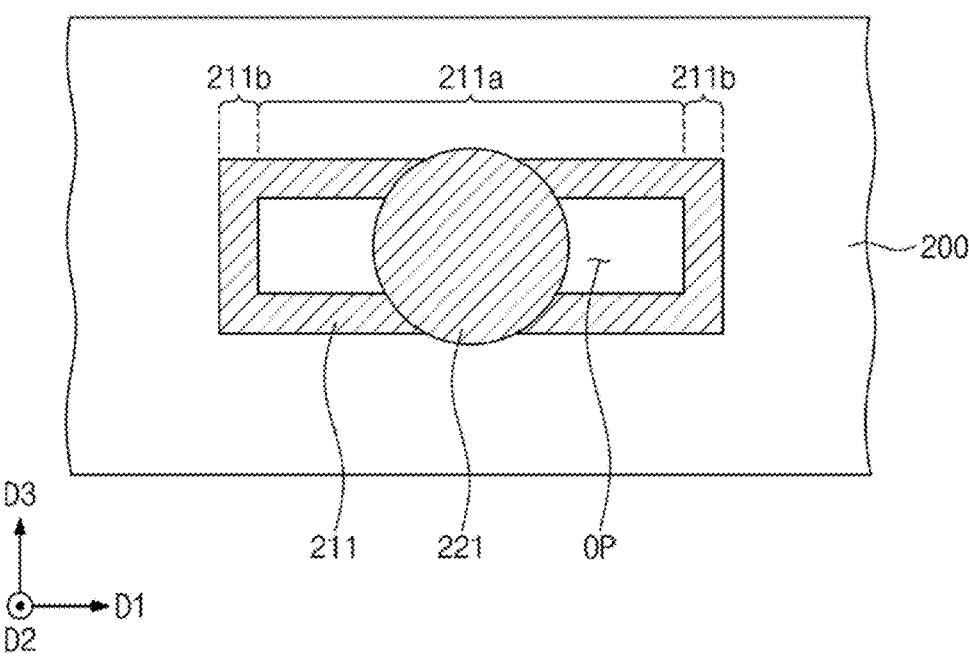

FIG. 7 is a plan view illustrating a semiconductor device according to an example embodiment of the inventive concepts. In the following description, an element described above may be identified by the reference number without repeating an overlapping description thereof, for the sake of brevity.

Referring to FIG. 7, a semiconductor device 13 may have the same or substantially similar structure as the semiconductor device 10 described with reference to FIG. 1. In the semiconductor device 13, the via structure 221 may have the same or substantially similar shape (e.g., a circular pillar shape) as that in the example embodiment of FIG. 4. In the semiconductor device 13, the metal layers 211 may have the same or substantially similar shape as that in the example embodiment of FIGS. 5 and 6, unlike that in the example embodiment of FIG. 4. When viewed in a plan view, a distance between the first portions 211a may be smaller than a diameter of the via structure 221. Thus, the metal layers 211 may be in contact with the via structure 221.

Figure 8:
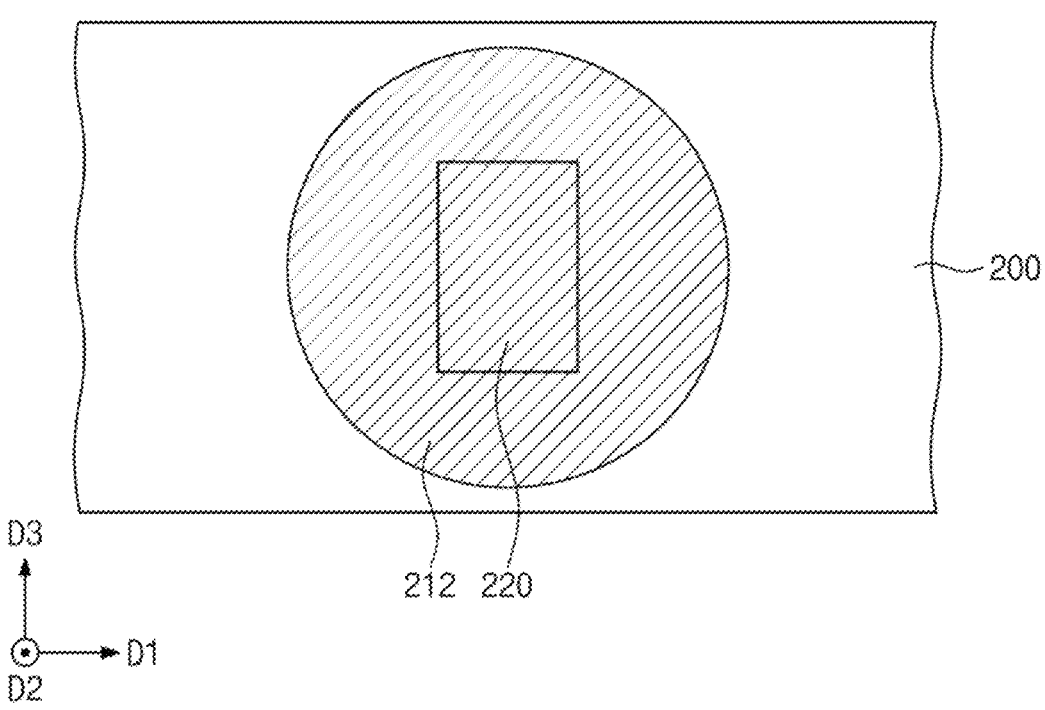

FIG. 8 is a plan view illustrating a semiconductor device according to an example embodiment of the inventive concepts. In the following description, an element described above may be identified by the reference number without repeating an overlapping description thereof, for the sake of brevity.

Referring to FIG. 8, a semiconductor device 14 may have the same or substantially similar structure as that described with reference to FIG. 1. In the semiconductor device 14, the via structure 220 may have the same or substantially similar shape as that in the example embodiment of FIG. 3, but the inventive concepts are not limited to this example. For example, the via structure 220 may include the via structure 221, which has the same shape as that in the example embodiment of FIG. 4. Unlike the example embodiment of FIG. 3, the semiconductor device 14 may include metal layers 212, each of which is provided to have a circular shape, when viewed in a plan view. In some example embodiments, each of the metal layers 212 may have an elliptical shape, when viewed in a plan view. A diameter of each of the metal layers 212 may be larger than widths of the via structure 220 in the first and third directions D1 and D3, when viewed in a plan view. Here, the via structure 220 may be disposed in the metal layers 212, when viewed in a plan view.

Figure 9:
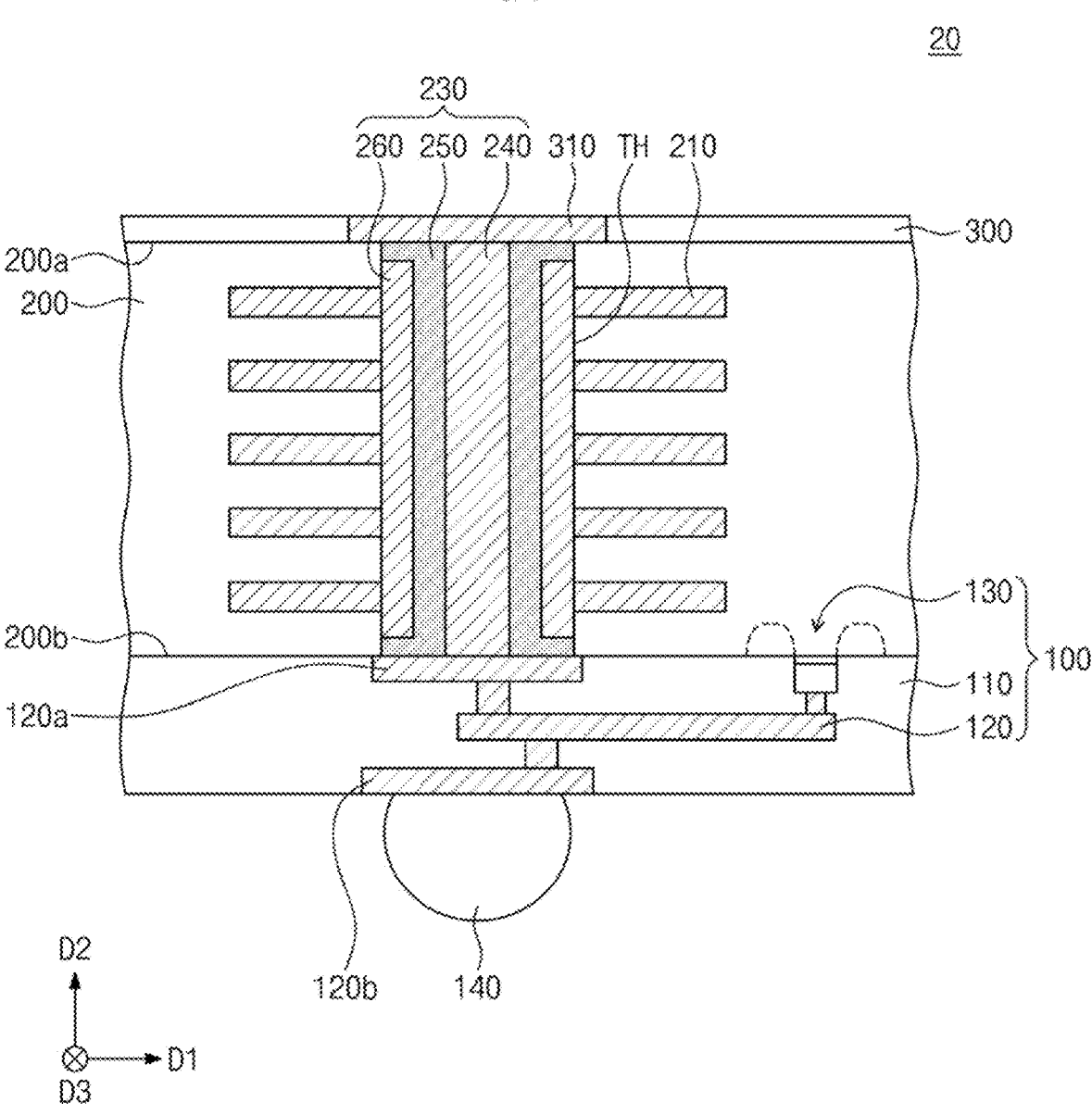
FIG. 9 is a sectional view illustrating a semiconductor device according to an example embodiment of the inventive concepts.
Figure 10:
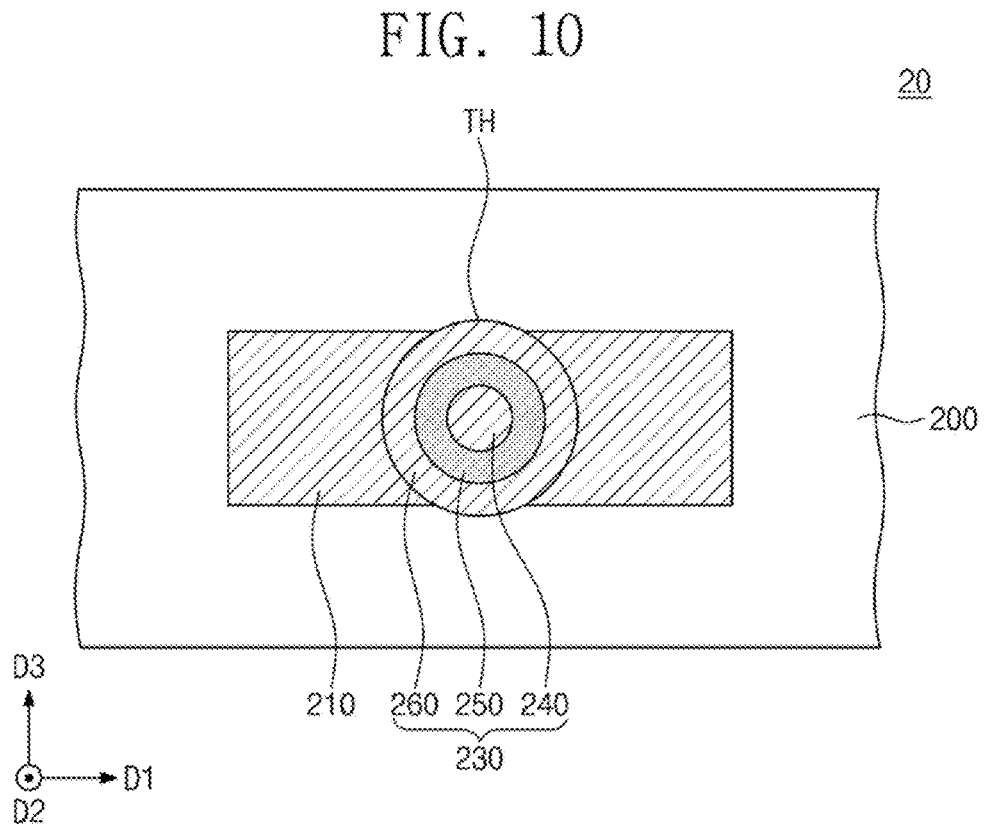
FIGS. 10 and 11 are plan views, each of which illustrates a semiconductor device according to an example embodiment of the inventive concepts.

FIG. 9 is a sectional view illustrating a semiconductor device according to an example embodiment of the inventive concepts. FIG. 10 is a plan view illustrating a semiconductor device according to an example embodiment of the inventive concepts. In the following description, an element described above may be identified by the reference number without repeating an overlapping description thereof, for the sake of brevity.

Referring to FIGS. 9 and 10, a semiconductor device 20 may include the circuit layer 100, the semiconductor substrate 200, the protection layer 300, and the connection terminal 140. The circuit layer 100, the protection layer 300, and the connection terminal 140 may be the same as or substantially similar to those described with reference to FIG. 1. The metal layers 210 are illustrated to have the same planar shape as that in the example embodiments of FIGS. 3 and 4, but in an example embodiment, the metal layers 210 may have the same shape (e.g., a ring shape) as that in the example embodiments of FIGS. 5 to 7.

A via structure 230 may be provided in a penetration hole TH, which is vertically penetrates the semiconductor substrate 200 and the metal layers 210. The via structure 230 may include a first via 260, a second via 240, and an inter-metal insulating layer 250.

The first via 260 may be provided in the penetration hole TH. The first via 260 may be extended along an inner surface of the penetration hole TH and in the second direction D2. The first via 260 may cover a portion of the inner surface of the penetration hole TH. A portion of an outer side surface of the first via 260 facing the penetration hole TH may be in contact with the metal layers 210. The first via 260 may be spaced apart from the first and second surfaces 200a and 200b of the semiconductor substrate 200. That is, the first via 260 may not be in contact with the uppermost interconnection pattern 120a and the connection pad 310. The first via 260 may have a circular pillar shape having an open hole therein. In other words, the first via 260 may be a pipe-shaped pattern extending in the second direction D2. The first via 260 may be formed of or include at least one of conductive materials. For example, the first via 260 may be formed of or include at least one of copper (Cu), aluminum (Al), tungsten (W), or titanium (Ti).

The second via 240 may be provided in the open hole of the first via 260. The second via 240 may be extended in the second direction D2. The second via 240 may be extended from the first surface 200a of the semiconductor substrate 200 to the second surface 200b. A top surface of the second via 240 may be located at a vertical level higher than a top surface of the first via 260. A bottom surface of the second via 240 may be located at a vertical level lower than a bottom surface of the first via 260. When measured in the second direction D2, a length of the second via 240 may be larger than a length of the first via 260. The second via 240 may be enclosed by the first via 260. The second via 240 may be spaced apart from the first via 260. The top surface of the second via 240 may be in contact with the connection pad 310. The bottom surface of the second via 240 may be in contact with the uppermost interconnection pattern 120a. The second via 240 may be a pattern extending in the second direction D2 and having a circular pillar shape. The second via 240 may be formed of or include at least one of conductive materials. A material of the second via 240 may be different from a material of the first via 260. In some example embodiments, the second via 240 and the first via 260 may be formed of the same material. The second via 240 may be formed of or include at least one of copper (Cu), aluminum (Al), tungsten (W), or titanium (Ti).

The inter-metal insulating layer 250 may be interposed between the first via 260 and the second via 240. The inter-metal insulating layer 250 may be extended in the second direction D2. An upper portion of the inter-metal insulating layer 250 may be extended to a region on the top surface of the first via 260. A lower portion of the inter-metal insulating layer 250 may be extended to a region under the bottom surface of the first via 260. The inter-metal insulating layer 250 may enclose a side surface of the second via 240. The first via 260 and the second via 240 may be spaced apart from each other with the inter-metal insulating layer 250 interposed therebetween. In other words, the inter-metal insulating layer 250 may be provided in (e.g., within) the first via 260 and may have a pipe shape enclosing the second via 240. A top surface of the inter-metal insulating layer 250 may be coplanar with the top surface of the second via 240. The top surface of the inter-metal insulating layer 250 may be in contact with the connection pad 310. A bottom surface of the inter-metal insulating layer 250 may be coplanar with the bottom surface of the second via 240. The bottom surface of the inter-metal insulating layer 250 may be in contact with the uppermost interconnection pattern 120a. The first via 260 may be spaced apart from the connection pad 310 and the lowermost interconnection pattern 120a with the inter-metal insulating layer 250 interposed therebetween. The inter-metal insulating layer 250 may be formed of or include at least one of silicon oxide, silicon nitride, silicon oxynitride, or low-k dielectric materials.

Figure 11:
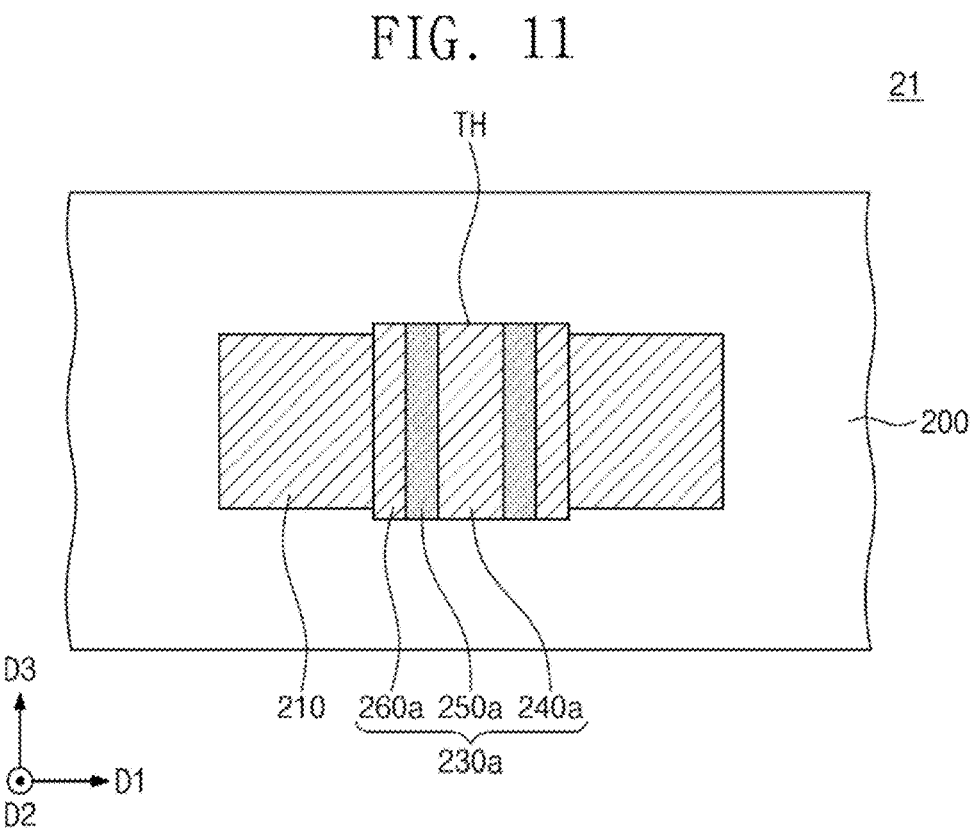

FIG. 11 is a plan view illustrating a semiconductor device according to an example embodiment of the inventive concepts. In the following description, an element described above may be identified by the reference number without repeating an overlapping description thereof, for the sake of brevity.

Referring to FIG. 11, a semiconductor device 21 may have the same section shape as that of the semiconductor device 20 described with reference to FIG. 9. In the semiconductor device 21, when viewed in a plan view, the via structure 230a may have a tetragonal (e.g., rectangular or square) shape, unlike the example embodiment of FIG. 10.

The via structure 230a may be provided in the penetration hole TH, which vertically penetrates the semiconductor substrate 200 and the metal layers 210. The penetration hole TH may have a tetragonal (e.g., rectangular or square) shape, when viewed in a plan view. The via structure 230a may include first vias 260a, a second via 240a, and inter-metal insulating layers 250a.

The first vias 260a may be provided in the penetration hole TH. The first vias 260a may be extended in the second direction D2. The first vias 260a may be spaced apart from each other in the first direction D1. For example, the first vias 260a may be plate-shaped patterns, which are parallel to the second and third directions D2 and D3 and are spaced apart from each other in the first direction D1. The first vias 260a may be disposed in the penetration hole TH to face each other. For example, the first vias 260a may be respectively disposed on first and second inner walls of the penetration hole TH, which are spaced apart from each other in the first direction D1. A portion of an outer side surface of each of the first vias 260a facing the penetration hole TH may be in contact with the metal layers 210. The first vias 260a may be spaced apart from the first and second surfaces 200a and 200b of the semiconductor substrate 200. That is, the first vias 260 may not be in contact with the uppermost interconnection pattern 120a and the connection pad 310. The first vias 260a may be formed of or include at least one of conductive materials. The first vias 260a may be formed of or include at least one of copper (Cu), aluminum (Al), tungsten (W), or titanium (Ti).

The second via 240a may be provided between the first vias 260a. The second via 240a may be extended in the second direction D2. For example, the second via 240a may be a plate-shaped pattern that is parallel to the second and third directions D2 and D3. The second via 240a may be extended from the first surface 200a of the semiconductor substrate 200 to the second surface 200b of the semiconductor substrate 200. A top surface of the second via 240a may be located at a vertical level higher than the top surface of each of the first vias 260a. A bottom surface of the second via 240a may be located at a vertical level lower than the bottom surface of each of the first vias 260a. When measured in the second direction D2, a length of the second via 240a may be larger than a length of each of the first vias 260a. The second via 240a may be spaced apart from the first vias 260a. The top surface of the second via 240a may be in contact with the connection pad 310. The bottom surface of the second via 240a may be in contact with the uppermost interconnection pattern 120a. The second via 240a may be formed of or include at least one of conductive materials. The second via 240a may be formed of or include a material different from that of the first vias 260a. In some example embodiments, the second via 240a and the first vias 260a may be formed of the same material. The second via 240a may be formed of or include at least one of copper (Cu), aluminum (Al), tungsten (W), or titanium (Ti).

The inter-metal insulating layers 250a may be interposed between the first vias 260a and the second via 240a. The inter-metal insulating layers 250 may be spaced apart from each other with the second via 240a interposed therebetween. Each of the inter-metal insulating layers 250a may be extended in the second direction D2. For example, the inter-metal insulating layers 250a may be plate-shaped patterns, which are parallel to the second and third directions D2 and D3 and are spaced apart from each other in the first direction D1. In other words, one of the first vias 260a, one of the inter-metal insulating layers 250a, the second via 240a, the other of the inter-metal insulating layers 250a, and the other of the first vias 260a may be plate-shaped patterns, which are parallel to the second and third directions D2 and D3, and may be sequentially arranged in the first direction D1. Upper portions of the inter-metal insulating layers 250a may be extended to regions on top surfaces of the first vias 260a. Lower portions of the inter-metal insulating layers 250a may be extended to regions under bottom surfaces of the first vias 260a. Top surfaces of the inter-metal insulating layers 250a may be coplanar with the top surface of the second via 240a. The top surfaces of the inter-metal insulating layers 250a may be in contact with the connection pad 310. Bottom surfaces of the inter-metal insulating layers 250a may be coplanar with the bottom surface of the second via 240a. The bottom surfaces of the inter-metal insulating layers 250a may be in contact with the uppermost interconnection pattern 120a. The first vias 260a and the second via 240a may be spaced apart from each other with the inter-metal insulating layers 250a interposed therebetween. The first vias 260a may be spaced apart from the connection pad 310 and the uppermost interconnection pattern 120a with the inter-metal insulating layers 250a interposed therebetween. The inter-metal insulating layers 250a may be formed of or include at least one of silicon oxide, silicon nitride, silicon oxynitride, or low-k dielectric materials.

According to the example embodiments of FIGS. 9 to 11, the via structure may be formed of or include an insulating layer that is interposed between the first and second vias, which are formed of a conductive material. The first via, which is disposed outside the insulating layer, may be in contact with metal layers. The second via, which is disposed inside the insulating layer, may be spaced apart from the first via and the metal layers and may be in contact with a connection pad and an interconnection pattern, which are used to deliver an electrical signal. That is, the first via and the metal layers in the semiconductor device may be in an electrically-floated state. Thus, in the semiconductor device, the first via and the metal layers may be used to dissipate a heat energy generated in the semiconductor device, and the second via may be used to transmit an electrical signal. Because the via structure with the insulating layer is provided in the semiconductor device, it may be possible to reduce noise in an electrical signal transmitted through the second via.

Figure 12:
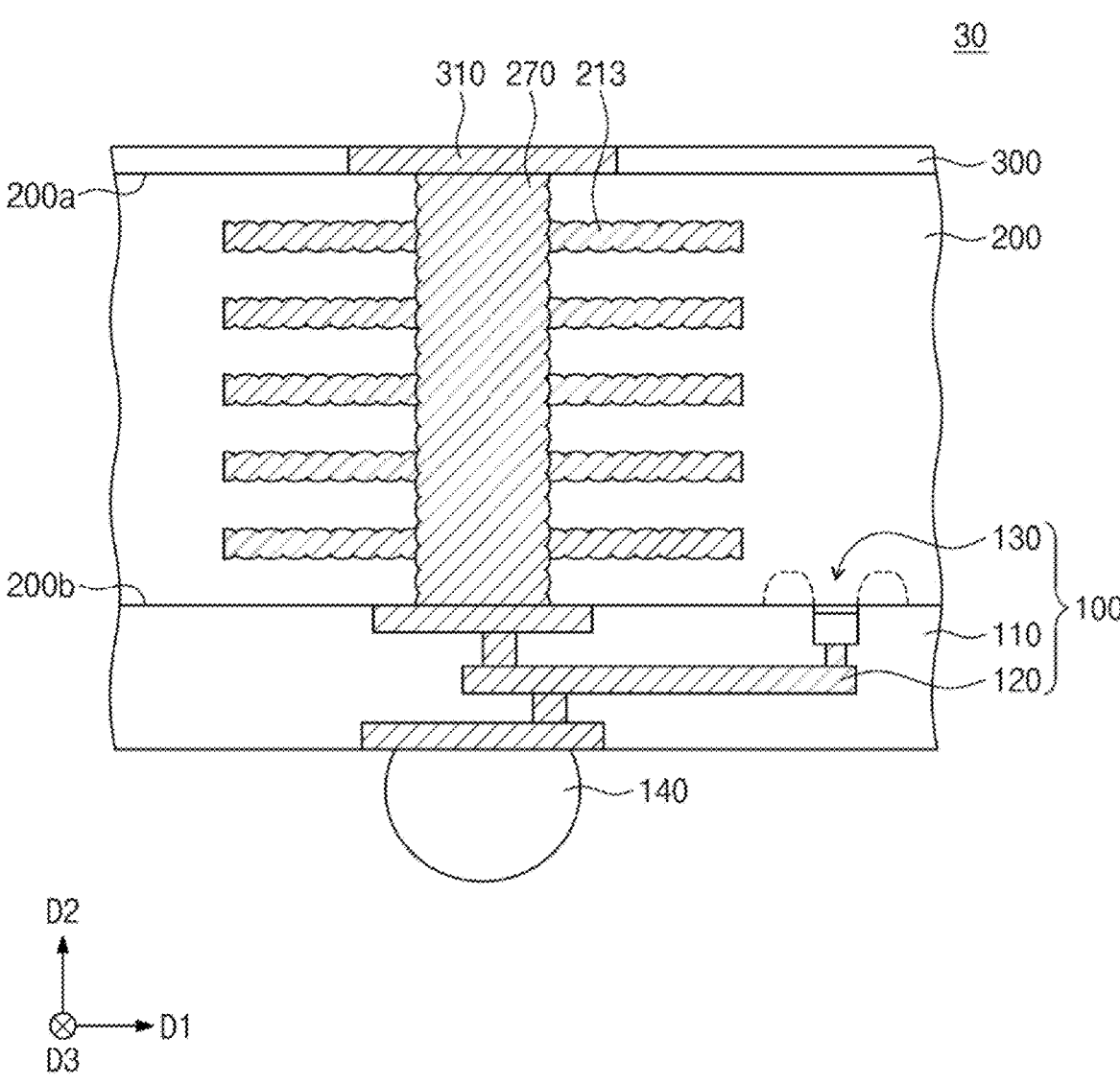
FIG. 12 is a sectional view illustrating a semiconductor device according to an example embodiment of the inventive concepts.

FIG. 12 is a sectional view illustrating a semiconductor device according to an example embodiment of the inventive concepts. In the following description, an element described above may be identified by the reference number without repeating an overlapping description thereof, for the sake of brevity.

Referring to FIG. 12, a semiconductor device 30 may include the circuit layer 100, the semiconductor substrate 200, the protection layer 300, and the connection terminal 140. The circuit layer 100, the protection layer 300, and the connection terminal 140 may be the same as or substantially similar to those in the example embodiment described with reference to FIG. 1. Furthermore, a via structure 270 and metal layers 213 may be disposed in the same manner as that in the example embodiment described with reference to FIG. 1. The planar shapes of the metal layers 213 and the via structure 270 are not illustrated but may be the same as one of the example embodiments of FIGS. 3, 4, 6, 7, 8, 10, and 11.

The metal layers 213 and the via structure 270 may have a surface roughness greater than those of the first and second surfaces 200a and 200b of the semiconductor substrate 200. Each of the metal layers 213 and the via structure 270 may include a plurality of fine protruding portions and a plurality of fine recess portions, which are formed on a surface thereof. For example, the metal layers 213 and the via structure 270 may have scallop-shaped surfaces. The first and second surfaces 200a and 200b of the semiconductor substrate 200 may be relatively flat, compared with the surfaces of the metal layers 213 and the via structure 270. The protruding and recess portions of the metal layers 213 and the via structure 270 may be in contact with the semiconductor substrate 200 without any gap therebetween.

According to an example embodiment of the inventive concepts, the metal layers 213 and the via structure 270 may have great surface roughness, and thus, a contact area between them and the semiconductor substrate 200 may be increased, compared with the case that they have flat surfaces. Thus, the metal layers 213 and the via structure 270 may dissipate heat energy, which is generated in the semiconductor device, through an increased surface area that is larger than in the case where they have the flat surface.

Figure 13:
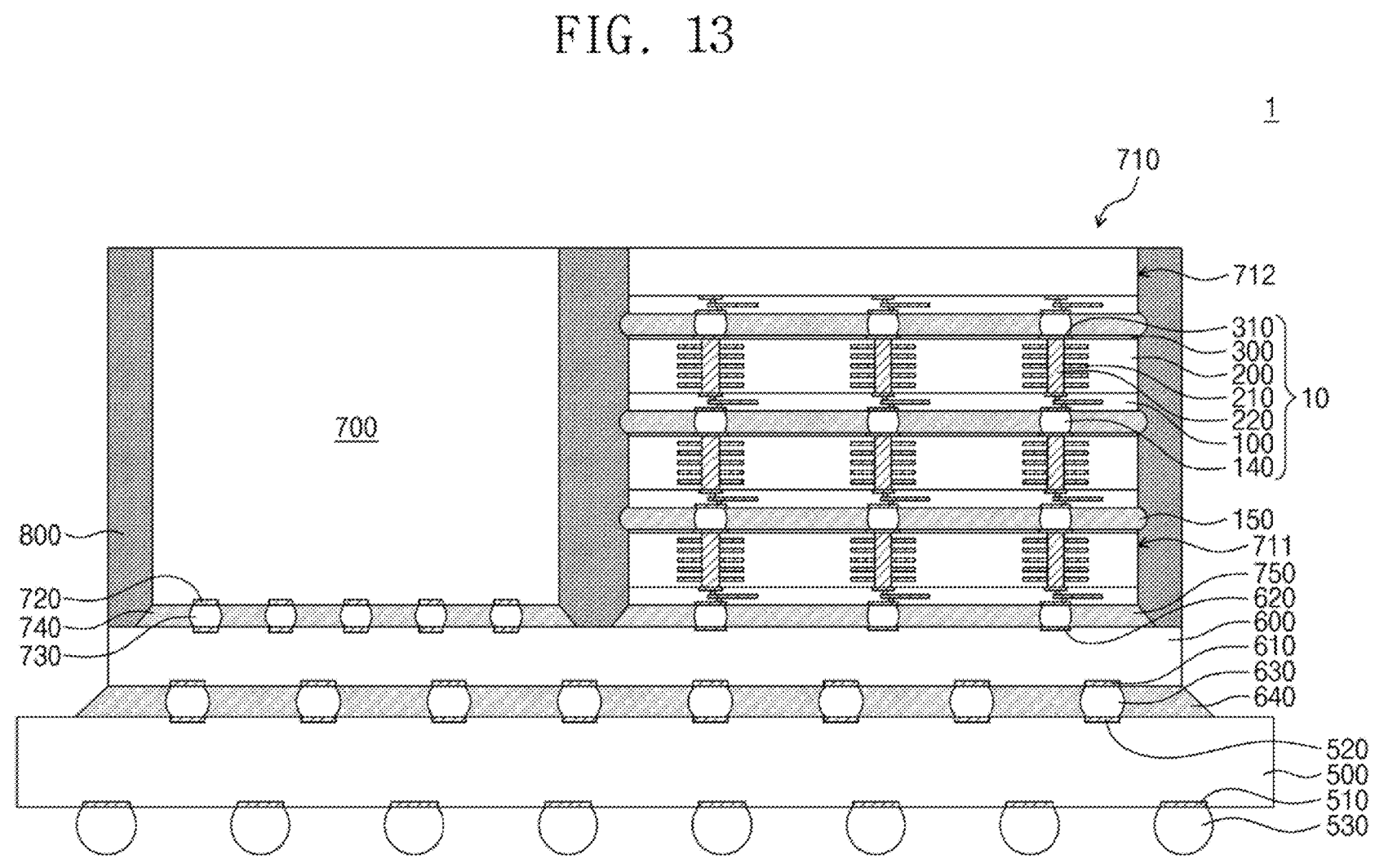

FIG. 13 is a sectional view illustrating a semiconductor package including a semiconductor device according to an example embodiment of the inventive concepts.

Referring to FIG. 13, a semiconductor package 1 may include a package substrate 500, an interposer substrate 600, a first semiconductor chip 700, and a chip stack 710.

The package substrate 500 may be a printed circuit board including interconnection patterns, which are printed on top and bottom surfaces thereof. In some example embodiments, the package substrate 500 may be a redistribution substrate including a plurality of insulating layers, which are sequentially stacked, and an interconnection layer, which is provided in the insulating layers. First upper pads 520 may be disposed on a top surface of the package substrate 500. The first upper pads 520 may be exposed to the outside of the package substrate 500 near or at the top surface of the package substrate 500. First lower pads 510 may be disposed on a bottom surface of the package substrate 500. The first lower pads 510 may be exposed to the outside of the package substrate 500 near or at the bottom surface of the package substrate 500. The first upper pads 520 and the first lower pads 510 may be electrically connected to each other through an interconnection layer, which is provided in the package substrate 500. The first upper pads 520 and the first lower pads 510 may be formed of or include at least one of conductive materials (e.g., copper (Cu), aluminum (Al), and/or nickel (Ni)).

Outer connection terminals 530 may be disposed on the bottom surface of the package substrate 500. The outer connection terminals 530 may be disposed on the first lower pads 510. The outer connection terminals 530 may include solder balls and/or solder bumps. The outer connection terminals 530 may be formed of or include at least one of tin (Sn), silver (Ag), copper (Cu), nickel (Ni), bismuth (Bi), indium (In), antimony (Sb), cerium (Ce), or alloys thereof. Depending on the kind of the outer connection terminals 530, the semiconductor package 1 may be provided in the form of a ball-grid array (BGA) structure, a fine ball-grid array (FBGA) structure, or a land grid array (LGA) structure.

The interposer substrate 600 may be provided on the package substrate 500. Second upper pads 620 may be disposed on a top surface of the interposer substrate 600. The second upper pads 620 may be exposed to the outside of the interposer substrate 600 near or at the top surface of the interposer substrate 600. Second lower pads 610 may be disposed on a bottom surface of the interposer substrate 600. The second lower pads 610 may be exposed to the outside of the interposer substrate 600 near or at the bottom surface of the interposer substrate 600. The second upper pads 620 and the second lower pads 610 may be electrically connected to each other through an interconnection layer provided in the interposer substrate 600. Unlike the illustrated example, the second upper pads 620 may be vertically aligned to the second lower pads 610, and a penetration electrode may connect the second upper pads 620 to the second lower pads 610. For example, the penetration electrode may include one of the structures including the via structure and the metal layers, described with reference to FIGS. 1 to 12.

The interposer substrate 600 may be mounted on the package substrate 500 in a flip-chip manner. For example, the interposer substrate 600 may be mounted on the package substrate 500 through substrate connection terminals 630, which are provided between the first upper pads 520 and the second lower pads 610. The substrate connection terminals 630 may include solder balls and/or solder bumps. The substrate connection terminals 630 may be formed of or include at least one of tin (Sn), silver (Ag), copper (Cu), nickel (Ni), bismuth (Bi), indium (In), antimony (Sb), cerium (Ce), or alloys thereof.

A first under-fill pattern 640 may be provided between the interposer substrate 600 and the package substrate 500. The first under-fill pattern 640 may enclose the substrate connection terminals 630 and fill a space between the substrate connection terminals 630.

The first semiconductor chip 700 may be provided on the interposer substrate 600. The first semiconductor chip 700 may include a logic chip or a buffer chip. The logic chip may include an application specific integrated circuit (ASIC) chip or an application processor (AP) chip. In some example embodiments, the logic chip may include a central processing unit (CPU) or a graphics processing unit (GPU). The ASIC chip may include an application specific integrated circuit (ASIC). In some example embodiments, the first semiconductor chip 700 may be a memory chip.

The first semiconductor chip 700 may include chip pads 720, which are exposed to the outside of the first semiconductor chip 700 near or at a bottom surface of the first semiconductor chip 700. The chip pads 720 may be electrically connected to an integrated circuit in the first semiconductor chip 700. The chip pads 720 may be formed of or include at least one of conductive materials. For example, the chip pads 720 may be formed of or include copper (Cu).

The first semiconductor chip 700 may be mounted on the interposer substrate 600 in a flip chip manner. For example, the first semiconductor chip 700 may be mounted on the interposer substrate 600 through chip connection terminals 730, which are provided between the chip pads 720 and the second upper pads 620. The chip connection terminals 730 may include solder balls and/or solder bumps. The chip connection terminals 730 may be formed of or include at least one of tin (Sn), silver (Ag), copper (Cu), nickel (Ni), bismuth (Bi), indium (In), antimony (Sb), cerium (Ce), or alloys thereof.

A second under-fill pattern 740 may be provided between the first semiconductor chip 700 and the interposer substrate 600. The second under-fill pattern 740 may enclose the chip connection terminals 730 and fill a space between the chip connection terminals 730.

The chip stack 710 may be provided on the interposer substrate 600. The chip stack 710 may include a plurality of second semiconductor chips 711, which are stacked on the interposer substrate 600. The chip stack 710 is illustrated to include four second semiconductor chips 711, but the inventive concepts are not limited to this example. The number of the stacked second semiconductor chips 711 may be changed, as desired. The second semiconductor chips 711 may be a semiconductor chip that is of a kind different from the first semiconductor chip 700. As an example, the second semiconductor chips 711 may be memory chips.

In the following, the structure of the second semiconductor chips 711 may be described based on one of the second semiconductor chips 711.

The second semiconductor chip 711 may include at least one of the semiconductor devices described with reference to FIGS. 1 to 12. As an example, the second semiconductor chip 711 may include the same elements (e.g., the circuit layer 100, the semiconductor substrate 200, the metal layers 210, the via structure 220, the protection layer 300, the connection pad 310, and the connection terminal 140) as the semiconductor device 10 described with reference to FIG. 1. The connection terminal 140 of the second semiconductor chip 711 may be coupled to the connection pad 310 of another second semiconductor chip 711 adjacent thereto. The second semiconductor chip 711 may be electrically connected to another one of the second semiconductor chip 711 through the connection terminal 140.

A second semiconductor chip 712, which is the uppermost one of the second semiconductor chips 711, may include a circuit layer, which is provided under a bottom surface thereof and has the same or substantially similar structure as the circuit layer 100 of FIG. 1.

A third under-fill pattern 150 may be provided between the second semiconductor chips 711. The third under-fill pattern 150 may enclose the connection terminal 140, between two adjacent ones of the second semiconductor chips 711. The third under-fill pattern 150 may protrude from side surfaces of the second semiconductor chips 711. The third under-fill pattern 150 may include a non-conductive film (NCF) or a non-conductive paste (NCP). In some example embodiments, the third under-fill pattern 150 may be formed of or include at least one of insulating polymers.

On the interposer substrate 600, the chip stack 710 may be horizontally spaced apart from the first semiconductor chip 700. The chip stack 710 may be mounted on the interposer substrate 600 in a flip chip manner. The chip stack 710 may be mounted on the interposer substrate 600 through the connection terminal 140 of the lowermost one of the second semiconductor chips 711. The chip stack 710 and the first semiconductor chip 700 may be electrically connected to each other through the interposer substrate 600. In an example embodiment, a plurality of chip stacks 710 may be provided on a plurality of interposer substrates 600, although not shown.

A fourth under-fill pattern 750 may be provided between the chip stack 710 and the interposer substrate 600. The fourth under-fill pattern 750 may fill a space between the chip stack 710 and the interposer substrate 600 and my enclose the connection terminal 140.

A mold layer 800 may be provided on the interposer substrate 600. The mold layer 800 may cover the top surface of the interposer substrate 600 and may enclose the first semiconductor chip 700 and the chip stack 710. The mold layer 800 may expose a top surface of the first semiconductor chip 700 and a top surface of the chip stack 710, but the inventive concepts are not limited to this example. In an example embodiment, the mold layer 800 may be provided on the interposer substrate 600 to encapsulate or bury the first semiconductor chip 700 and the chip stack 710. The mold layer 800 may be formed of or include an insulating polymer (e.g., an epoxy-based molding compound).

According to an example embodiment of the inventive concepts, a semiconductor device may include a via structure vertically penetrating a substrate and metal layers such that the metal layers has a shape protruding from the via structure. The metal layers in contact with the via structure may be used to easily dissipate heat, which is generated from the semiconductor device. Accordingly, it may be possible to improve thermal stability of the semiconductor device.

In addition, the via structure may be a multi-layered structure including an insulating layer. The insulating layer may be used to physically separate a first layer of the via structure, which is used for signal conduction, from a second layer of the via structure, which is used for heat dissipation. Accordingly, it may be possible to reduce a noise signal in semiconductor device.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate having a first surface and a second surface opposite to the first surface;
   a protection layer on the first surface of the substrate;
   metal layers in the substrate, the metal layers extending in a first direction parallel to the first surface, the metal layers spaced apart from each other in a second direction perpendicular to the first surface;
   a via structure vertically penetrating the metal layers and the substrate;
   a circuit layer on the second surface of the substrate; and
   a connection terminal on a bottom surface of the circuit layer,
   wherein each of the metal layers has a tetragonal or circular shape, when viewed in a plan,

the circuit layer comprises an interconnection pattern therein and an integrated device on the second surface of the substrate, and the via structure is electrically connected to the integrated device and electrically connected to the connection terminal through the interconnection pattern.

2. The semiconductor device of claim 1, wherein
the via structure has a tetragonal shape, when viewed in a plan view,
the via structure comprises
first vias separated from each other in the first direction,
a second via between the first vias, and
insulating layers interposed between the first vias and the second via, and
an outer side surface of each of the first vias is in contact with the metal layers.

3. The semiconductor device of claim 1, wherein
the via structure has a circular shape, when viewed in a plan view, and
the via structure comprises
a first via extending in the second direction,
a second via enclosing the first via, and
an insulating layer interposed between the first via and the second via.

4. The semiconductor device of claim 1, wherein the metal layers and the via structure have a first surface roughness greater than a second surface roughness of the first surface of the substrate.

5. The semiconductor device of claim 1, wherein the metal layers comprise
first portions extending in the first direction and penetrating the via structure, and
second portions extending in a third direction crossing the first direction and connecting opposite end portions of the first portions to each other.

6. The semiconductor device of claim 1, wherein the metal layers have a plate shape.

7. The semiconductor device of claim 1, wherein the metal layers vertically overlap each other.

8. The semiconductor device of claim 1, wherein a first width of each of the metal layers is smaller than a second width of the substrate.

9. The semiconductor device of claim 1, wherein
the via structure has a tetragonal shape, when viewed in a plan view, and
the via structure has first side surfaces that are parallel to second side surfaces of each of the metal layers.

10. A semiconductor device, comprising:
a semiconductor substrate having a first surface and a second surface opposite to the first surface;
a circuit layer on the second surface of the semiconductor substrate;
a connection terminal on a bottom surface of the circuit layer;
a via structure vertically penetrating the semiconductor substrate; and
metal layers penetrating the via structure in a first direction parallel to the first surface of the semiconductor substrate,
wherein the metal layers are spaced apart from each other in a second direction perpendicular to the first surface of the semiconductor substrate, and
wherein the metal layers comprise
first portions extending in the first direction to penetrate the via structure; and

16 second portions extending in a third direction crossing the first direction and connecting opposite end portions of the first portions to each other.

11. The semiconductor device of claim 10, wherein
the metal layers have an opening, and
the opening comprises a first opening and a second opening, the first opening and the second opening being spaced apart from each other in the first direction with the via structure interposed therebetween.

12. The semiconductor device of claim 10, wherein
the first portions of the metal layers are spaced apart from each other in the third direction, and
the second portions of the metal layers are spaced apart from each other in the first direction.

13. The semiconductor device of claim 10, wherein each of the metal layers has a tetragonal shape, when viewed in a plan view.

14. The semiconductor device of claim 10, wherein
the via structure has a tetragonal shape, when viewed in a plan view,
the via structure comprises
first vias separated from each other in the first direction,
a second via between the first vias, and
insulating layers interposed between the first vias and the second via, and
the metal layers are in contact with an outer side surface of each of the first vias.

15. The semiconductor device of claim 10, wherein
the via structure has a circular shape, when viewed in a plan view, and
the via structure comprises
a first via extending in the second direction,
a second via enclosing the first via, and
an insulating layer interposed between the first via and the second via.

16. The semiconductor device of claim 10, wherein the metal layers and the via structure have a first surface roughness greater than a second surface roughness of the first surface of the semiconductor substrate.

17. The semiconductor device of claim 10, wherein first widths of the metal layers are smaller than a second width of the semiconductor substrate.

18. The semiconductor device of claim 10, further comprising:
a connection pad on the first surface of the semiconductor substrate, the connection pad coupled to the via structure; and
a protection layer on the first surface of the semiconductor substrate, the protection layer enclosing the connection pad.

19. A semiconductor device, comprising:
a semiconductor substrate having a first surface and a second surface opposite to each other;
a circuit layer on the second surface of the semiconductor substrate;
a connection terminal on a bottom surface of the circuit layer;
a via structure vertically penetrating the semiconductor substrate; and
metal layers protruding outward from the via structure,
wherein the metal layers are spaced apart from each other in a direction perpendicular to the semiconductor substrate;
wherein the via structure comprises
first vias separated from each other in a first direction parallel to the first surface of the semiconductor substrate, a second via provided between the first vias, and insulating layers interposed between the first vias and the second via, and wherein the metal layers are in contact with an outer side surface of each of the first vias.

* * * * *